United States Patent [19]

Boyacigiller et al.

[11] Patent Number: 4,465,996
[45] Date of Patent: Aug. 14, 1984

[54] HIGH ACCURACY DIGITAL-TO-ANALOG CONVERTER

[75] Inventors: Ziya G. Boyacigiller, Hayward; James L. Brubaker, San Jose; Jerome C. Zis, Cupertino, all of Calif.

[73] Assignee: Intersil, Inc., Cupertino, Calif.

[21] Appl. No.: 381,386

[22] Filed: May 24, 1982

Related U.S. Application Data

[63] Continuation of Ser. No. 240,073, Mar. 3, 1981, abandoned.

[51] Int. Cl.³ .............................................. H03K 13/02
[52] U.S. Cl. ......................... 340/347 DA; 340/347 CC
[58] Field of Search .................. 340/347 DA, 347 CC

[56] References Cited

U.S. PATENT DOCUMENTS

| | | | |
|---|---|---|---|
| 4,070,665 | 1/1978 | Glennon | 340/347 CC |
| 4,272,760 | 6/1981 | Prazak | 340/347 CC |
| 4,318,085 | 3/1982 | Whiteside | 340/347 CC |

OTHER PUBLICATIONS

Galalu et al., USSR Ministry of Higher and Specialized Secondary Education Proceedings of Higher Educational Institution Instrument Designing, vol. 18, No. 4, 1975, pp. 47-52.
Rullgard, "IBM Technical Disclosure Bulletin", vol. 10, No. 1, Jun. 1967, pp. 5-6.

Primary Examiner—C. D. Miller
Attorney, Agent, or Firm—Spensley, Horn, Jubas & Lubitz

[57] ABSTRACT

A high accuracy monolithic digital to analog converter (DAC) which employs an EPROM controlled correction DAC to correct for errors in the output of a primary DAC. The correction DAC empolys a non-binary bit weighting which permits the use of low accuracy components in the fabrication of the correction DAC. The output of the primary DAC is skewed so that the required correction is always in a single direction, thereby eliminating the need for a constant offset generator. Resistors necessary for bipolar operation are included on the chip, thereby eliminating the need for connection of any external resistors to achieve such operation.

12 Claims, 4 Drawing Figures

UNIPOLAR

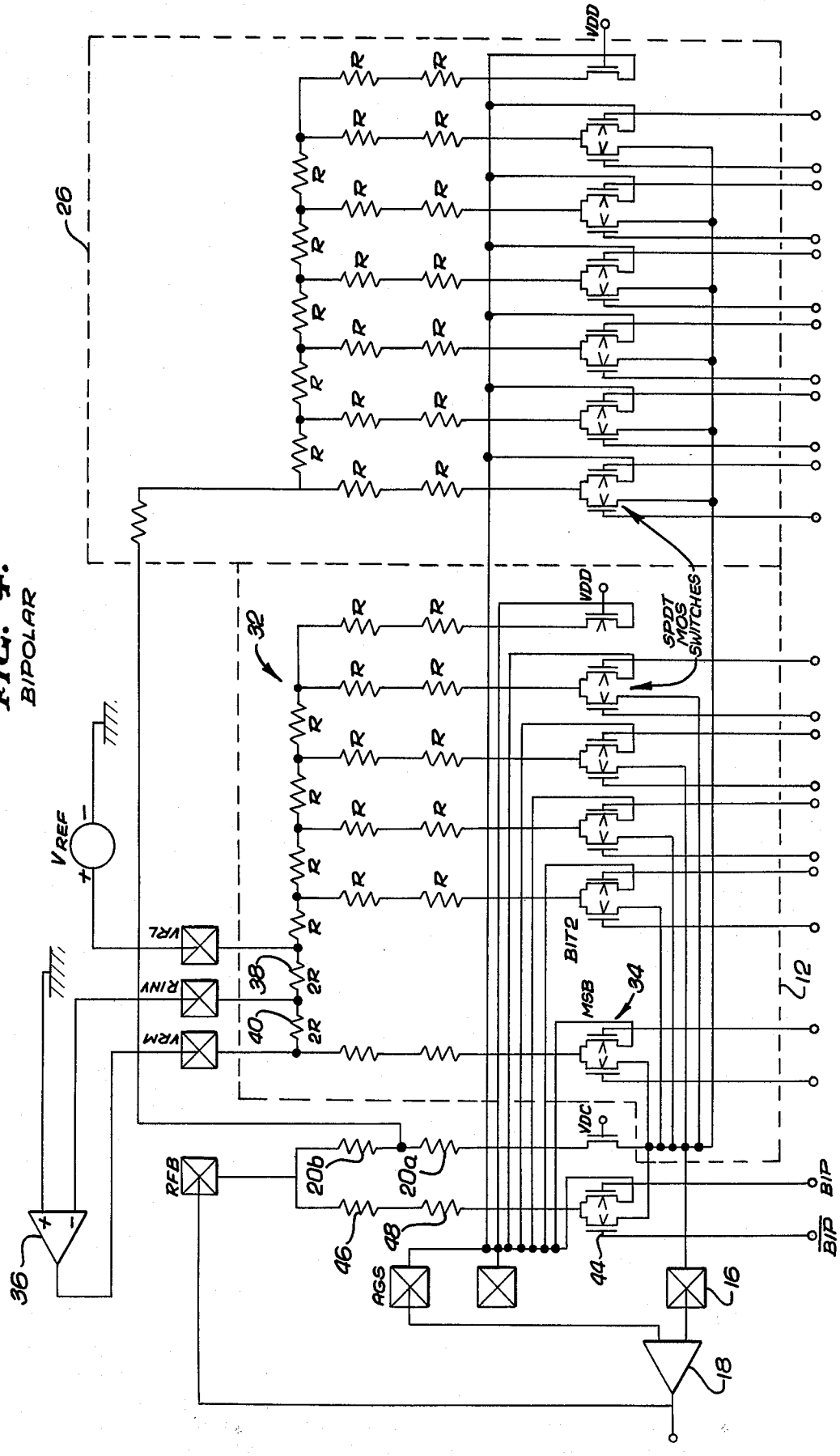
Fig. 4. BIPOLAR

HIGH ACCURACY DIGITAL-TO-ANALOG CONVERTER

This is a continuation, of application Ser. No. 240,073, filed Mar. 3, 1981 aband.

BACKGROUND OF THE INVENTION

1. Field of the Invention

This invention relates to digital-to-analog converters (DAC's), and more particularly to monolithic digital to analog convertors utilizing an R-2R ladder-type circuit.

2. Description of the Prior Art

Prior circuits have employed various correction schemes to increase the conversion accuracy of digital to analog converters. Among the methods used in these prior art DAC's are correcting the more significant bits of the DAC by the use of zener diodes, metal links, thin film links and thin film resistor laser trimming. These methods have several drawbacks, including high cost, the requirement for a large amount of chip area in monolithic applications and the inability to readjust the device so as to change the amount of correction applied.

Another type of correction scheme is employed in U.S. Pat. No. 4,070,665 to Glennon, et al. In this system a main DAC, a read only memory device (PROM) and an additional correction DAC are used to provide a high accuracy conversion. The conversion error corresponding to each main DAC digital input code is initially determined. The correction DAC is utilized to generate a correction signal which compensates for the error of the main DAC. The proper digital input to the correction DAC for each main DAC input code is determined and stored in the memory device. The main DAC input serves as the address for the memory. The correction signal is added to the output of the main DAC so as to result in a more accurate analog system output. In order to insure that all error correction is in one direction, a constant offset signal generator is employed. The output of the constant offset device is added to the outputs of the main and correction DAC's, and the PROM is programmed so that the correction DAC compensates for the offset signal as well as the main DAC error.

The system described in the Glennon patent utilizes a four bit correction DAC to provide an analog correction signal. If more accurate correction is desired, a correction DAC having increased resolution is required. Generally, this increased resolution is obtained by the use of high accuracy components, which increases manufacturing difficulty and therefore cost of the device.

It is an object of the present invention to provide a high accuracy digital-to-analog converter which utilizes a correction DAC and a programmable memory to provide an input to the correction DAC. It is another object of the invention to provide a high accuracy digital-to-analog converter without the need for high accuracy components in the correction DAC. It is a further object of the invention to provide a high accuracy monolithic digital-to-analog converter while utilizing a minimum amount of chip space. Yet another object of the invention is to eliminate the need for a correction DAC which is required to subtract as well as add current, or for a constant offset current generator.

SUMMARY OF THE INVENTION

These and other objects are achieved in the present invention by the use of a system including a correction DAC which is designed so as to generate a bit to bit ratio of less than two, as opposed to the use of a standard binary DAC. By incorporating a correction DAC of this type in the system, analog correction values having a resolution greater than the accuracy of the correction DAC itself may be generated. If a conventional binary weighted DAC were utilized, gaps might appear in the output range of the DAC, with the result that certain desired correction analog outputs could not be generated. The use of a non-binary weighting overcomes this problem.

In order to eliminate the need for a constant offset generator or similiar device, the primary DAC is designed so that its output is always less than the ideal output in a normal DAC. This skewing of the output enables the correction provided by the correction DAC to always be in one direction, thus eliminating the need for a correction DAC that can subtract as well as add current, or for a negative constant offset current generator.

Since the operation of the convertor system may change over a period of time, it may be desirable to change the amount of correction provided by the correction DAC. Therefore, the present invention utilizes an erasable memory (EPROM), which enables correction codes to be erased and the memory reprogrammed so as to recalibrate the system. Such a recalibration operation is not possible with any type of device which incorporates a non-repeatable correction operation.

BRIEF DESCRIPTION OF THE DRAWINGS

A detailed description of the invention will be made with reference to the accompanying drawings wherein:

FIG. 4 is an electrical diagram showing a portion of the digital to analog converter of the present invention and additional components connected so that the converter will operate in a bipolar mode.

DESCRIPTION OF THE PREFERRED EMBODIMENT

Figure 1:
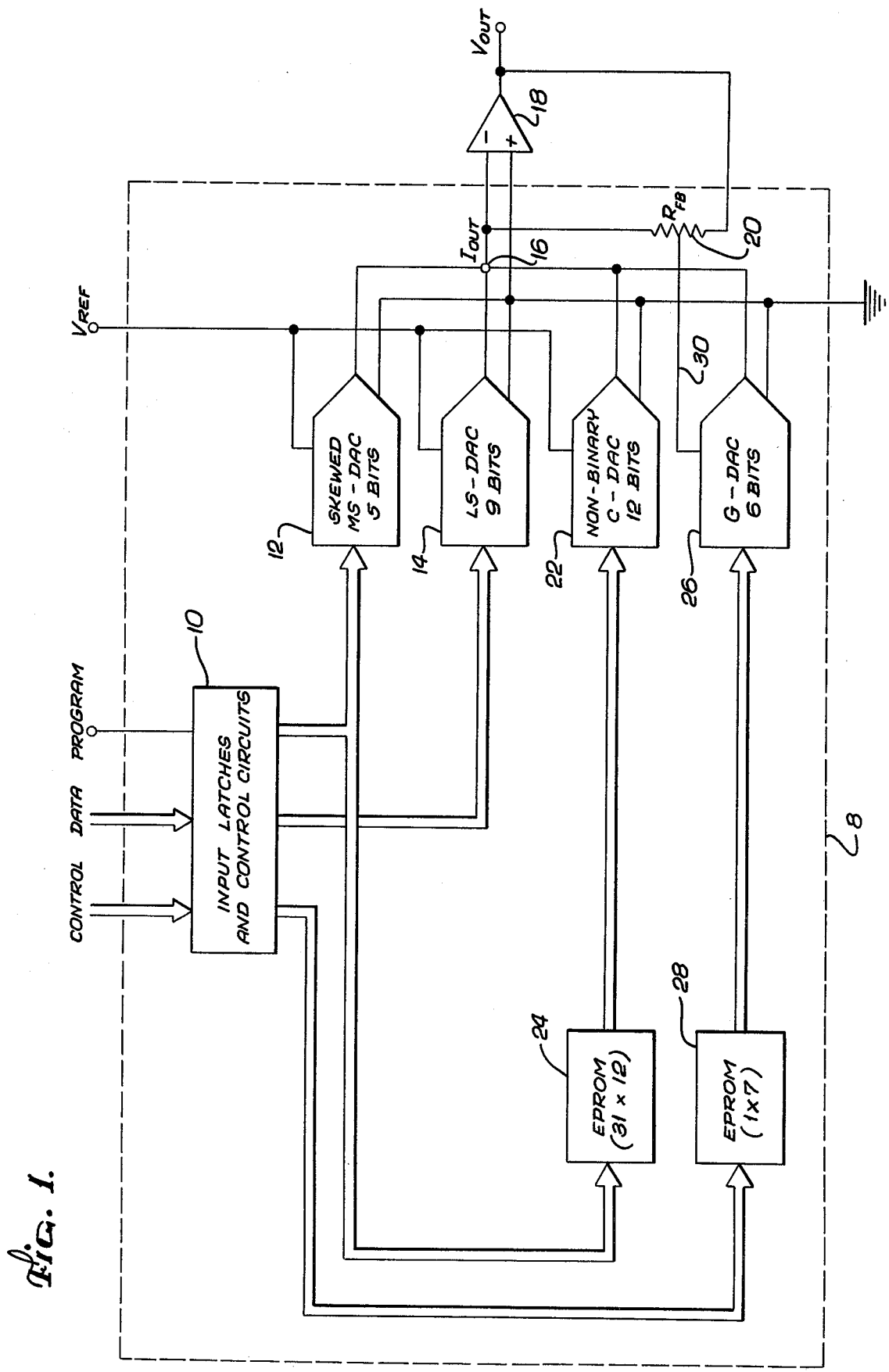
FIG. 1 is an electrical block diagram of a monolithic high accuracy digital to analog converter in accordance with the present invention.

Referring to FIG. 1, the preferred embodiment of the present invention is a monolithic integrated cricuit 8 which includes an input latch and control circuit section 10 which receives external control, data and programming signals. The input latches deliver digital signals to be converted to a fourteen bit primary DAC, which in the present embodiment of the invention comprises a five bit R-2R ladder type CMOS more significant DAC (MS-DAC) 12 and a nine bit R-2R ladder type CMOS less significant DAC (LS-DAC) 14. It should be understood that the sizes of the various DAC's are given for purposes of illustration only. The MS-DAC and LS-DAC deliver analog output currents to an Iout node 16. This node is connected to the negative input of an external amplifier 18, which provides an output Vout. Negative feedback is added by means of a feedback resistor 20 located on the chip 8.

Because of errors introduced by various sources, the analog output provided by the primary DAC may not exactly correspond to the digital input. In order to correct for any such errors, a separate twelve bit R-2R ladder type CMOS correction DAC (C-DAC) 22 is employed. The C-DAC provides an analog output which corrects for errors of the MS-DAC and is added to the outputs of the MS-DAC and LS-DAC at node 16. The C-DAC receives as its digital input the output of an erasable programmable read only memory (EPROM) 24. The EPROM 24 is addressed by the five bit digital input to the MS-DAC. In order to determine the amount of correction required for each particular MS-DAC input code, a test sequence is conducted in which each possible MS-DAC combination is turned on one at a time and the analog output of the MS-DAC is measured. The error between the actual and ideal MS-DAC output is then determined and a C-DAC input code which provides an analog output to correct for the MS-DAC error is selected and stored in the EPROM 24. For example, if the MS-DAC input code 10000 corresponds to an ideal output of 16 volts but the measured output of the MS-DAC is 15.85 volts, the C-DAC must provide an output of 0.15 volts in order to correct for the error in the MS-DAC. The digital code to the C-DAC which will provide the necessary 0.15 volt output is then determined and stored in the EPROM 24 in a location corresponding to a 10000 address location. Thus, whenever a 10000 input is applied to the MS-DAC, the EPROM 24 will be addressed so that the proper correction code will be applied to the C-DAC, which in turn will generate an analog output which corrects for the error of the MS-DAC. In a similar fashion, the error is determined and a proper correction code stored in the EPROM 24 for every possible input combination to the MS-DAC.

In order to achieve proper operation, the C-DAC must produce an output that exactly cancels the error of the MS-DAC for each MS-DAC input code. The fineness of the correction required determines the least significant bit (LSB) size of the correction DAC. The largest expected errors to be corrected determine the C-DAC full scale weight requirement. In a particular embodiment of the present invention, these constraints specify that a twelve bit resolution C-DAC be employed. In order to achieve the most accurate correction, the C-DAC must be able to produce any desired value in the range between its LSB sze and its full scale output to an accuracy of within one LSB. One way to meet this requirement is to utilize a conventional binary weighted DAC of high precision as the C-DAC, i.e., one in which DAC inaccuracies are less than the weight of an LSB. This would require a high accuracy twelve bit DAC in the present embodiment of the invention, with correspondingly high cost. The present invention is intended to provide the necessary range of correction without the use of a high accuracy C-DAC.

In a conventional binary DAC, each successive bit is exactly one-half the size of the preceeding bit. Therefore, the sum of all bits lower than a given bit is equal in weight to that bit minus one LSB weight. For example, in a ten bit system, the relative bit weightings will be 512, 256, 128, 64, 32, 16, 8, 4, 2 and 1. The sum of the first five bits is equal to the sixth bit minus 1:

$$1+2+4+8+16=32-1$$

Successive analog values are generated by adding one bit to the input code (e.g., 111 for an output of 7 and $111+1=1000$ for an output of 8). As long as DAC inaccuracies are less than the weight of one LSB, an analog output anywhere within the range of one LSB to full scale output may be produced to a resolution of one LSB. This will not be the case, however, if DAC inaccuracies are comparable to or larger than the weight of an LSB. For example, if the largest DAC errors are equal to eight times the weight of an LSB, the analog output corresponding to the sum of all the bits smaller than a given bit may be as much as nine LSB's less than that bit. These inaccuracies lead to possible gaps in the DAC output range. For example, assume that the correction DAC has actual bit outputs as shown in Table 1.

TABLE 1

| Bit | Binary DAC Output | |
|---|---|---|
| | Ideal output | Actual output (typical) |
| 1 | $2^0 = 1$ | 1.013 |
| 2 | $2^1 = 2$ | 2.035 |
| 3 | $2^2 = 4$ | 3.920 |
| 4 | $2^3 = 8$ | 8.264 |
| 5 | $2^4 = 16$ | 15.515 |
| 6 | $2^5 = 32$ | 30.723 |
| 7 | $2^6 = 64$ | 67.202 |
| 8 | $2^7 = 128$ | 131.030 |

Because of the inaccuracies between the actual and ideal bit outputs, it will be impossible for the DAC to produce certain outputs. Thus, if a correction value of 64 is required to be generated by the C-DAC, bit 7 would be activated, i.e., the digital input would be 1000000. Because of the inaccuracy of the DAC, however, the actual output would be 67.202 rather than the desired 64. The desired output of 64 cannot be generated by activating a different combination of bits, since an input of 111111 would only result in an output of 61.47 (the sum of bits 1 to 6). Therefore, a gap would exist in the output range of the C-DAC between 61.47 and 67.202, corresponding to the transition between a binary input of 111111 and 1000000. That is, it is impossible to generate an actual output which falls anywhere between 61.47 and 67.202. Similar gaps will exist throughout the DAC's output range.

The present invention employs a C-DAC in which there are no gaps in the output range, despite the fact that inaccurancies may exceed the weight of an LSB. As previously stated, in a conventional binary DAC, the nominal value of each bit is exactly twice that of the preceding bit. The present invention utilizes a C-DAC in which each successive bit is slightly less than twice the value of the preceding bit. For example, if the bits are related by a factor of 1.8 rather than 2, the ideal output values for each bit will be as shown in Table 2. Typical output values due to DAC inaccuracies are also shown.

TABLE 2

| Bit | Non-binary (1.8) DAC output | |
|---|---|---|
| | Ideal output | Actual output (typical) |
| 1 | $1.8^0 = 1$ | .971 |
| 2 | $1.8^1 = 1.8$ | 1.810 |
| 3 | $1.8^2 = 3.24$ | 3.157 |
| 4 | $1.8^3 = 5.83$ | 5.892 |
| 5 | $1.8^4 = 10.50$ | 10.121 |
| 6 | $1.8^5 = 18.90$ | 17.955 |

TABLE 2-continued

| | Non-binary (1.8) DAC output | |
|---|---|---|
| Bit | Ideal output | Actual output (typical) |
| 7 | $1.8^6 = 34.01$ | 36.503 |
| 8 | $1.8^7 = 61.22$ | 64.124 |

Unlike a binary DAC, inaccuracies in the non-binary DAC will not result in gaps in the output range. Assume that an analog correction output of 34 is desired. If the C-DAC where ideal, bit 7 would be activated, i.e., a 7 bit input code of 1000000 would be provided, and the analog output would be equal to 34.01. However, in the example given, the actual output would be 36.503, and precise correction would not be achieved. However, due to the non-binary weighting of the C-DAC, an output closer to the desired value of 34 can be generated by providing a 6 bit input code of 111000, resulting in an output of $17.955 + 10.121 + 5.892 = 33.968$.

The important characteristic of the non-binary C-DAC discussed above is that it has overlapping outputs, since the sum of all bits past a given bit is larger than that bit. The output "overlaps" because as the digital input increases the analog output at some points will actually decrease (e.g., a 10000 input provides an analog output which is less than that provided by a 1111 input). Such is not the case with a binary system, where the addition of one bit always adds an analog value of 1 to the output (assuming no inaccuracy).

Figure 2:
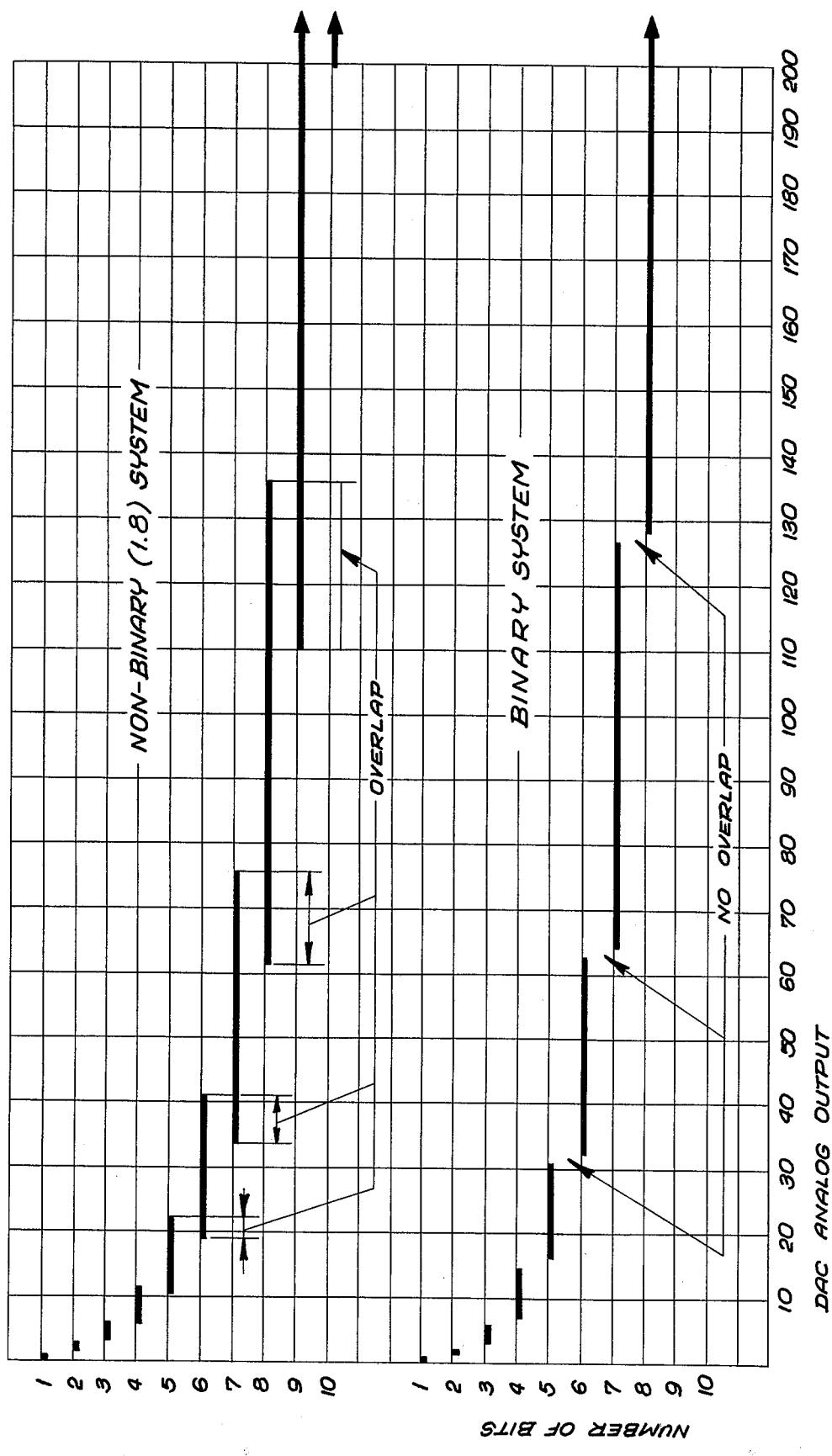
FIG. 2 are graphs showing the output ranges of digital-to-analog converters employing binary and non-binary weighting schemes.

A comparison of the output ranges for various input codes to binary and non-binary DAC's is shown in Table 3 and FIG. 2.

TABLE 3

| # of bits | digital input code range | analog input range for binary | analog output range for non-binary (1.8) |
|---|---|---|---|
| 1 | 0–1 | 0–1 | 0–1 |
| 2 | 10–11 | 2–3 | 1.8–2.8 |
| 3 | 100–111 | 4–7 | 3.24–6.04 |
| 4 | 1000–1111 | 8–15 | 5.83–11.87 |
| 5 | 10000–11111 | 16–31 | 10.50–22.37 |
| 6 | 100000–111111 | 32–63 | 18.90–41.27 |
| 7 | 1000000–1111111 | 64–127 | 34.01–75.38 |
| 8 | 10000000–11111111 | 128–255 | 61.22–136.50 |
| 9 | 100000000–111111111 | 256–611 | 110.20–246.70 |
| 10 | 1000000000–1111111111 | 612–1023 | 198.36–445.06 |
| 11 | 10000000000–11111111111 | 1024–2047 | 357.05–802.11 |
| 12 | 100000000000–111111111111 | 2048–4095 | 642.68–1444.79 |

As can be seen from Table 3 and FIG. 2, the non-binary DAC has an overlapping output range, whereas the binary DAC does not. Because of non-overlap in the binary DAC, inaccurancies may result in gaps in the output range, e.g., it may not be possible to produce a desired output with less than one bit resolution. If a non-binary C-DAC in which the bit weighting is chosen so that the amount of overlap in the non-binary C-DAC exceeds the largest DAC error is employed, no such gaps will exist in the C-DAC output. Thus, even though DAC inaccuracies may prevent analog outputs 34 or 35 from being generated by the C-DAC of Table 2 with a seven bit input code, such an output may still be generated with six bit input code. In the present embodiment of the invention, a 12 bit resolution C-DAC having an accuracy of 8 bits (a maximum error of 16 LSB's) is utilized.

By employing a non-binary weighting system, the C-DAC can provide precise correction values despite its inaccuracy. In operation, once the error of the MS-DAC is determined, an input code for the C-DAC which will provide an actual analog output that most closely cancels the error of the MS-DAC will be stored in the EPROM 24. By utilizing the non-binary C-DAC described, low cost, low accuracy components can be utilized but accurate correction can still be achieved.

Referring again to FIG. 1, in addition to the C-DAC 22 and EPROM 24, a separate six bit gain correction DAC 26 and EPROM 28 are utilized to correct for any mismatch between the MS-DAC and the LS-DAC, i.e., to correct for full scale gain error in the LS-DAC. With the exception of the amplifier 18, all of the components shown in FIG. 1 are fabricated on the chip 8. The gain correction DAC 26 is connected to the feedback resistor 20 at its reference voltage input via a line 30. A portion of the current through the feedback resistor 20 will therefore be diverted into the gain correction DAC 26. This current is then routed either to ground or to the output of the gain correction DAC and back to the Iout line. The input code to the gain correction DAC 26 determines what portion of the feedback current is routed to ground. In the present embodiment of the invention, the gain correction DAC 26 is controlled by a single PROM word from the EPROM 28 that is always selected in normal operation. This correction method eliminates the need for any type of external gain adjustment and allows temperature induced gain shifts to be reduced to an extremely low level by proper device scaling. The gain correction DAC effectively varies the value of the feedback resistor by controlling the amount of current which is fed back to the Iout line. Increasing the amount of current diverted to ground increases the effective feedback resistance value.

The MS-DAC 12 differs from conventional CMOS DAC's in two ways. First, the output of the MS-DAC is intentionally skewed with respect to that of the LS-DAC so that it is always less than the ideal output. The result of this is that the correction required is always an additional positive current, which is supplied by the C-DAC. The skewing of the MS-DAC eliminates the need for a C-DAC that can subtract as well as add current, or for a negative constant offset current generator. The skewing is accomplished by choosing the R-2R resistor values of the MS-DAC so that the MS-DAC output will be slightly lower than its ideal output. The C-DAC thus compensates both for conversion errors and for the intentional skewing of the MS-DAC.

Figure 3:
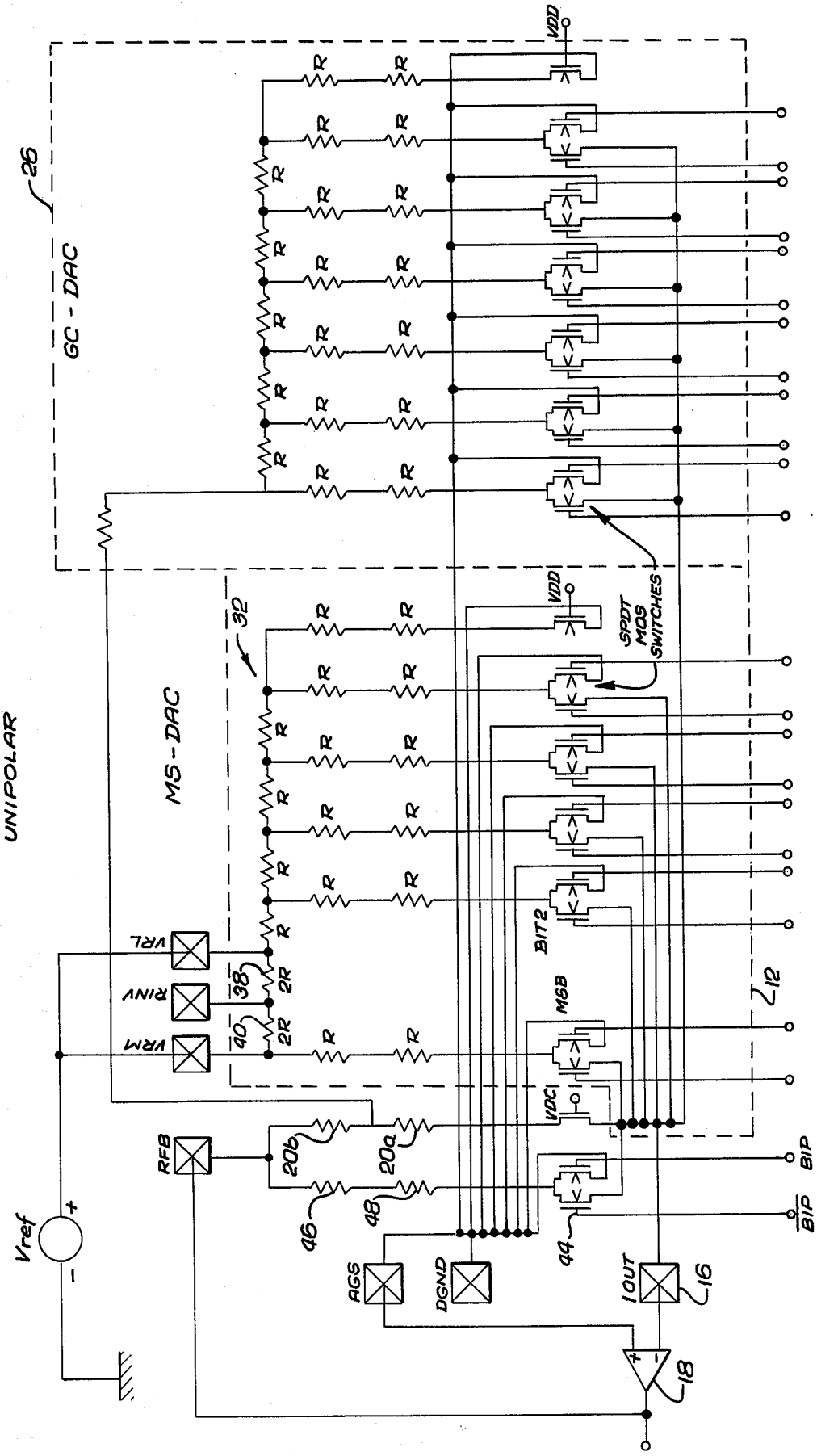
FIG. 3 is an electrical diagram showing a portion of the digital to analog converter of the present invention and additional components connected so that the converter will operate in a unipolar mode.

The second way in which the MS-DAC differs from conventional DAC's is in the manner in which it facilitates bipolar, or offset binary operation. In normal unipolar binary operation, the analog output of a DAC will range between zero for a digital input of all zeroes up to a maximum for a digital input of all ones. In bipolar operation, the analog output will range between a maximum negative voltage and a maximum positive voltage rather than increasing from zero in a single direction. In conventional DAC's, bipolar operation requires the use of external resistors and additional adjustments. The MS-DAC design of the present invention eliminates the need for any external resistors or adjustments. As can be seen in FIGS. 3 and 4, the MS-DAC is an R-2R ladder type DAC in which the most significant bit 34 is separated from the lower bits and a separate reference voltage connection at pad VRM is made. The reference voltage connection for the lower bits is made at a pad VRL. For unipolar operation, VRM and VRL are both connected to a reference voltage VREF as shown in FIG. 3. The reference voltage therefore will be the same for the most significant bit as for the remaining bits. Bipolar operation is achieved by making the reference voltage for the most significant bit (i.e., the voltage applied to VRM) exactly the negative of the voltage for the remaining bits (i.e., the voltage applied to VRL). When this is the case, turning on the most significant bit produces a −(full scale) output and turning on all bits below the most significant bit produces a +(full scale−1 LSB) output. This output transfer function corresponds to the commonly used 2's complement method of bipolar numbering. The desired voltage level at pad VRM is obtained by connecting the reference voltage to the pad VRL and an amplifier 36 to the pads VRM and RINV as shown in FIG. 4. Equal valued resistors 38 and 40 are connected between the VRL and RINV pads and VRM and RINV pads, respectively. The arrangement of the voltage reference VREF, the amplifier 36 and resistors 38 and 40 comprises a simple voltage inverter in which VRM=−(VRL×R1/R2)=−VRL. Thus, the desired reference voltages are obtained simply by the connection of the amplifier 36 to the chip at pads VRM and RINV without the need for any external resistors or adjustments. The circuit allows errors to be corrected by the C-DAC 22 in the usual manner. Errors caused by mismatch between the resistors 38 and 40 are corrected also, thereby eliminating the need for any external adjustments.

As shown in FIGS. 3 and 4, the gain correction DAC 26 comprises an R-2R ladder type DAC 42 located adjacent the MS-DAC 12. The feedback resistor 20 of FIG. 1 comprises two separate resistors 20a and 20b for bipolar operation. For unipolar operation, a switch 44 is activated to connect resistors 46 and 48 in parallel with the resistors 20a and 20b, thereby halving the feedback resistance of the circuit and decreasing the output swing. The switch 44 is controlled by a seventh bit stored in the PROM 28.

In summary, the present invention is directed to a high accuracy digital-to-analog converter which employs a primary DAC (comprised of a separate MS-DAC and LS-DAC in the present embodiment) whose output is corrected by means of an EPROM controlled correction DAC. Gain mismatch between the MS-DAC and LS-DAC is corrected by a separate EPROM controlled gain correction DAC, which operates by effectively modifying the value of the feedback resistance of the device. In order to provide the most accurate correction, the correction DAC employs a non-binary bit weighting with a bit to bit ratio of less than two. The output of the MS-DAC is skewed so that the correction required is always a positive current, thereby eliminating the need for a constant offset generator. Resistors necessary for bipolar operation are included on the chip and bipolar operation is achieved simply by connecting an external amplifier to the chip.

Although the invention has been described in terms of a particular embodiment, the description is simply for the purpose of illustration of the important aspects of the invention and is not to be taken in a limiting sense. Specifically, although the invention is described in terms of a monolithic circuit, the technique can also be employed in hybrid and other non-monolithic applications. Therefore, the scope of the invention should be determined by reference to the appended claims rather than the foregoing description.

I claim:

1. A high accuracy digital-to-analog converter for converting a digital input signal to an equivalent analog output signal, comprising:
   a primary digital-to-analog converter for receiving the digital input signal and providing a corresponding first analog signal;
   a programmable memory for receiving an address which corresponds to the digital input signal and providing a digital correction output signal;
   a correction digital-to-analog converter for receiving the digital correction signal from the memory and providing a corresponding second analog signal which is added to the first analog signal from the primary digital-to-analog converter to provide a final analog output signal, said correction digital-to-analog converter increasing the accuracy of the conversion of the digital input signal, wherein said correction digital-to-analog converter employs a non-binary series in which the value of each term above some specific term is less than the sume of the values of all preceding terms in the series, thereby eleiminating gaps in the output range of the correction digital-to-analog converter, and wherein the primary digital-to-analog converter is configured so that the first anlog signal will be skewed in a predetermined direction with respect to the ideal analog output corresponding to the digital input signal, whereby the correction required from the correction digital-to-analog converter will always be a single direction.

2. A digital-to-analog converter according to claim 1 wherein the primary digital to analog converter comprises a more significant digital-to-analog converter and less significant digital-to-analog converter for converting the more significant and less significant bits of a digital input signal, respectively, wherein the input to the more significant digital-to-analog converter also serves as the address for the programmable memory.

3. A digital-to-analog converter according to claim 2 further including a gain correction digital-to-analog converter for providing an analog output signal which corrects for mismatch between the outputs of the more significant digital-to-analog converter and the less significant digital-to-analog converter.

4. A digital-to-analog converter according to claim 3 further including a second programmable memory, wherein said second programmable memory provides a digital input to the gain correction digital-to-analog converter.

5. A digital-to-analog converter system according to claim 4 wherein the second programmable memory provides a single digital input to the gain correction digital-to-analog converter irrespective of the value of the digital input signal to the main digital to analog converter.

6. A digital-to-analog converter according to claims 4 or 5 further incuding a feedback resistance connected to the outputs of the main and correction digital-to-analog converters, wherein said feedback resistance is also connected to the gain correction digital-to-analog converter, wherein the gain correction digital-to-analog converter controls the effective value of the feedback resistance.

7. A digital-to-analog converter according to claim 6 wherein the more significant digital-to-analog converter, the less significant digital to analog converter, correction digital-to-analog converter and gain correction digital to analog converter each comprises an R-2R ladder-type converter.

8. A digital-to-analog converter according to claim 2 wherein the output of the more significant digital-to-analog converter is less than the ideal analog output corresponding to each digital input, whereby the correction digital-to-analog converter will always provide a positive analog value to be added to the output of the primary digital-to-analog converter.

9. A monolithic digital-to-analog converter according to claim 1 wherein the primary digital-to-analog converter comprises an R-2R ladder type converter, said monolithic digital-to-analog converter further including first and second series connected resistances located between the most significant bit of the primary digital-to-analog converter and the remaining bits of the primary digital-to-analog converter, whereby bipolar operation is facilitated without requiring connection of any external resistors.

10. A high accuracy digital-to-analog converter, comprising:
   a primary digital-to-analog converter including a more significant R-2R ladder type converter for converting the more significant bits of a digital input code and a less significant R-2R ladder type converter for converting the remaining bits of a digital input code, wherein the values of the resistances of the more significant converter with respect to the resistances of the less significant converter are such that the analog output of the more significant converter is skewed with respect to the analog output of the less significant converter;
   a correction digital-to-analog converter for providing an analog output which is added to the outputs of the more significant and less significant converters so as to correct for conversion errors of the more significant converter and to correct for the skewing of the more significant converter;
   a first programmable memory, which is addressed by a signal corresponding to the digital input code, for providing an input code to the correction digital-to-analog converter which will cause the correction digital-to-analog converter to generate a proper output corresponding to each possible input to the more significant converter;
   a gain correction digital-to-analog converter for providing an analog output which corrects for gain error of the less significant converter; and
   a second programmable memory for providing a digital input to the gain correction converter.

11. The digital-to-analog converter of claim 10 wherein the correction digital-to-analog converter employs a non-binary series in which each term in the series is less than twice the value of the preceding term in the series, whereby the correction digital-to-analog converter can generate appropriate correction signals despite inaccuracies in the correction digital-to-analog converter.

12. The digital-to-analog converter of claim 10 including a feedback resistance connected to the output of the converter, wherein said gain correction converter operates to effectively vary the value of the feedback resistance to a desired value.

* * * * *